United States Patent
Kim

(10) Patent No.: US 9,953,696 B2
(45) Date of Patent: Apr. 24, 2018

(54) REFRESH CONTROL CIRCUIT FOR TARGET REFRESH OPERATION OF SEMICONDUCTOR MEMORY DEVICE, AND OPERATING METHOD THEREOF

(71) Applicant: SK hynix Inc., Gyeonggi-do (KR)

(72) Inventor: Jung-Hyun Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/447,254

(22) Filed: Mar. 2, 2017

(65) Prior Publication Data

US 2018/0061476 A1  Mar. 1, 2018

(30) Foreign Application Priority Data

Aug. 23, 2016  (KR) .................. 10-2016-0106908

(51) Int. Cl.
| | | |
|---|---|---|
| *G11C 8/00* | (2006.01) | |
| *G11C 11/4078* | (2006.01) | |
| *G11C 11/406* | (2006.01) | |
| *G11C 11/4076* | (2006.01) | |

(52) U.S. Cl.
CPC ...... *G11C 11/4078* (2013.01); *G11C 11/4076* (2013.01); *G11C 11/40611* (2013.01)

(58) Field of Classification Search
CPC ........... G11C 11/4078; G11C 11/40611; G11C 11/4076
USPC .................................... 365/222, 236
See application file for complete search history.

(56) References Cited

U.S. PATENT DOCUMENTS

| | | | | |
|---|---|---|---|---|
| 9,431,081 B2* | 8/2016 | Jang | ......................... | G11C 8/08 |
| 9,685,240 B1* | 6/2017 | Park | .................. | G11C 11/40615 |
| 9,691,466 B1* | 6/2017 | Kim | ...................... | G11C 11/406 |
| 2014/0006704 A1* | 1/2014 | Greenfield | .......... | G06F 11/3037 |
| | | | | 711/106 |
| 2014/0085995 A1* | 3/2014 | Greenfield | ............... | G11C 7/24 |
| | | | | 365/201 |
| 2014/0177376 A1* | 6/2014 | Song | ..................... | G11C 29/783 |
| | | | | 365/230.03 |
| 2014/0189228 A1* | 7/2014 | Greenfield | ........ | G11C 11/40607 |
| | | | | 711/106 |
| 2015/0003180 A1* | 1/2015 | Kim | ...................... | G11C 11/406 |
| | | | | 365/222 |
| 2015/0089326 A1* | 3/2015 | Joo | ...................... | G06F 11/1016 |
| | | | | 714/767 |
| 2017/0011792 A1* | 1/2017 | Oh | ...................... | G11C 11/40622 |
| 2017/0110178 A1* | 4/2017 | Bains | ................ | G11C 11/40618 |
| 2017/0117030 A1* | 4/2017 | Fisch | .................... | G11C 11/406 |
| 2017/0140811 A1* | 5/2017 | Joo | .................... | G11C 11/40618 |

FOREIGN PATENT DOCUMENTS

KR  1020170078948  7/2017

* cited by examiner

*Primary Examiner* — Viet Q Nguyen

(74) *Attorney, Agent, or Firm* — IP & T Group LLP

(57) ABSTRACT

A semiconductor memory device may include: a memory cell region including a plurality of memory cells coupled between a plurality of word lines and a plurality of bit lines; and a refresh control block suitable for performing a first refresh operation onto the plurality of the word lines in response to a refresh signal, counting the number of active signals that are inputted between at least two neighboring refresh signals and when the counted number of the active signals is equal to or greater than a reference number, performing a second refresh operation onto a word line corresponding to a target address.

20 Claims, 10 Drawing Sheets

REFRESH CONTROL CIRCUIT FOR TARGET REFRESH OPERATION OF SEMICONDUCTOR MEMORY DEVICE, AND OPERATING METHOD THEREOF

CROSS-REFERENCE TO RELATED APPLICATIONS

The present application claims priority of Korean Patent Application No. 10-2016-0106908, filed on Aug. 23, 2016, which is incorporated herein by reference in its entirety.

BACKGROUND

1. Field

Exemplary embodiments of the present invention relate generally to a semiconductor design technology, and more particularly, to a refresh control circuit for a semiconductor memory device that is capable of performing a target refresh operation.

2. Description of the Related Art

A memory device may typically include a plurality of memory cells for storing data in the form of stored charges. Each memory cell may typically include a capacitor that stores charges (i.e., data) and a transistor that serves as a switch controlling the flow of charges to and from the capacitor. Whether a data is in a 'high' logic level (i.e., a logic value '1') or a 'low' logic level (i.e., a logic value '0') is decided based on whether there are charges in the capacitor of a memory cell including the data, that is, whether the terminal voltage of the capacitor is high or low.

Data are retained in the form of charges that are accumulated in a capacitor. Therefore, theoretically, there should be no power consumption in simply retaining the data. However, because of a current leak due to a PN junction of a transistor, the initial amount of charges that are stored in a capacitor may gradually disappear, thereby causing data loss. To prevent this data loss, the data of a memory cell has to be read before the data is lost, and then the memory cell has to be re-charged to refresh the charges based on the read data. This operation has to be performed periodically to retain the data and is known in the art as a refresh operation.

The refresh operation is carried out whenever a refresh command is inputted from a memory controller to a memory. The memory controller may repeatedly input the refresh command to the memory at a predetermined time interval which is determined in consideration of a data retention time of the memory device. The data retention time of the memory device may represent how long a memory cell may retain its data without performing a refresh operation. Since the memory cells are designed to have a data retention time which is not shorter than a predetermined standard, the term between the refresh operations may be decided based on the predetermined standard.

However, when the amount of charges stored in a memory cell is affected by the active-precharge of a word line that is disposed adjacent to a word line coupled to the memory cell, the data of the memory cell may be deteriorated within a shorter time than the refresh term. This phenomenon is called a Row Hammering effect.

FIG. 1 is a schematic diagram illustrating a portion of a cell array that is included in a memory device. In the drawing, 'BL0' and 'BL1' represent bit lines.

Referring to FIG. 1, 'WLK−1', 'WLK' and 'WLK+1' are three word lines that are disposedside by side in the inside of a cell array. The word line WLK marked with 'ATTACK_WL' may be a word line that is activated many times, a word line whose frequency of being activated is high, or a word line that is activated for a long time. The word line WLK−1 and the word line WLK+1 are word lines that are disposed adjacent to the word line WLK. Also, 'CELL_K−1', 'CELL_K', 'CELL_K' are memory cells that are coupled to the word line WLK−1, the word line WLK, and the word line WLK+1, respectively. The memory cells CELL_K−1, CELL_K, and CELL_K+1 may include cell transistors TR_K−1, TR_K and TR_K+1 and cell capacitors CAP_K−1, CAP_K and CAP_K+1, respectively.

In FIG. 1, when the word line WLK is activated many times, frequently activated, or activated for a long time, the voltage of the word line WLK may toggle frequently or the voltage of the word line WLK may be kept high for a long time. This may affect the data that are stored in the memory cells CELL_K−1 and CELL_K which are coupled to the word lines WLK−1 and WLK+1, respectively, due to a coupling effect occurring between the word line WLK and the word line WLK−1 and between the word line WLK and the word line WLK+1. The Row Hammering effect may shorten the time that the memory cells retain the data stored therein. The Row Hammering effect may be a serious concern, especially for high density semiconductor memory devices due to the increased proximity of neighboring word lines.

Normal refresh operations which sequentially refresh the plurality of word lines in a memory device when a refresh command is inputted do not specifically address data loss of memory cells due to the Row Hammering effect. Hence a new refresh operation is needed.

SUMMARY

Embodiments of the present invention are directed to providing a refresh control circuit capable of performing a target refresh operation capable of preventing data loss of memory cells due to the Row Hammering effect, a semiconductor memory device employing the refresh control circuit, and an operating method of the semiconductor memory device. The target refresh operation may be in addition to a normal refresh operation.

In accordance with an embodiment of the present invention, a semiconductor memory device may include: a memory cell region including a plurality of memory cells coupled between a plurality of word lines and a plurality of bit lines; and a refresh control block suitable for performing a first refresh operation onto the plurality of the word lines in response to a refresh signal, counting the number of active signals that are inputted between at least two neighboring refresh signals and when the counted number of the active signals is equal to or greater than a reference number, performing a second refresh operation onto a word line corresponding to a target address.

In accordance with another embodiment of the present invention, a refresh control circuit may include: an activator suitable for counting the number of active signals that are inputted between at least two neighboring refresh signals and when the counted number of the active signals is equal to or greater than a reference number, generating a row hammering activating signal; a refresh selector suitable for generating a first refresh selection signal and a second refresh selection signal in response to the refresh signal and the row hammering activating signal; a row hammering address detector that is activated in response to the row hammering activating signal, suitable for counting the number of identical external addresses among external addresses that are inputted whenever an active signal is activated, and when the counted number of the identical external addresses is equal to or greater than a predetermined number, detecting a row hammering address; a first refresh address generator suitable for generating a first refresh address by counting the refresh signal; a second refresh address generator that is activated in response to the row hammering activating signal, suitable for generating a second refresh address calculated based on the row hammering address; and an address selector suitable for selecting the first refresh address or the second refresh address in response to the first refresh selection signal and the second refresh selection signal.

In accordance with yet another embodiment of the present invention, an operating method of a semiconductor memory device may include: sequentially performing a first refresh operation onto a plurality of word lines in response to a refresh signal; and counting the number of active signals that are inputted between at least two neighboring refresh signals, and when the counted number of active signals is equal to or greater than a reference number, performing a second refresh operation onto a word line corresponding to a target address.

DETAILED DESCRIPTION

Figure 1:
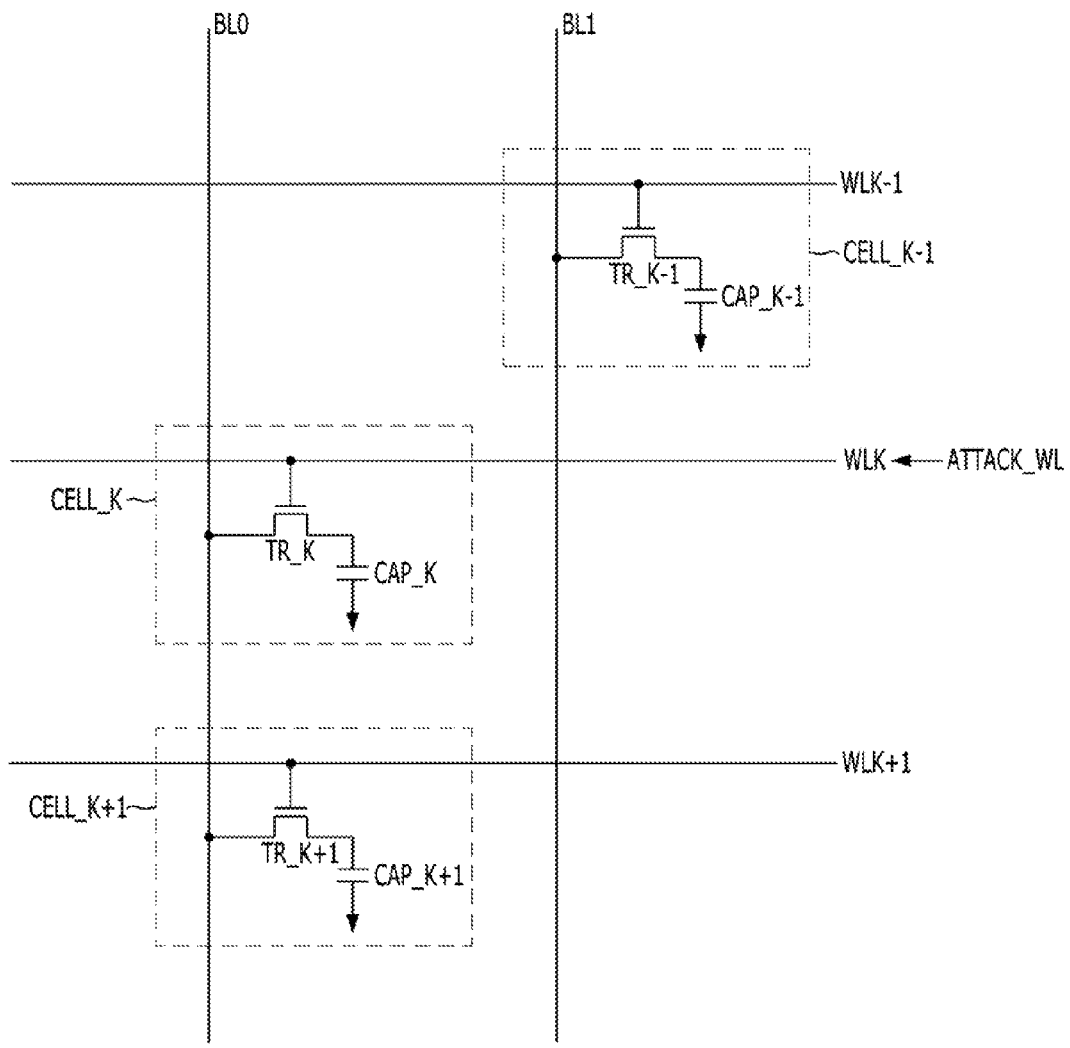
FIG. 1 is a schematic diagram illustrating a portion of a cell array that is included in a memory device to explain the Row Hammering effect

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete and will fully convey the scope of the present invention to those skilled in the art. Throughout the disclosure, like reference numerals refer to like parts throughout the various figures and embodiments of the present invention.

Hereafter, a target refresh operation of additionally refreshing a word line corresponding to a target address is described by referring to the accompanying drawings. For the sake of convenience in description, a structure related to rows is mainly illustrated in the drawings.

Figure 2A:
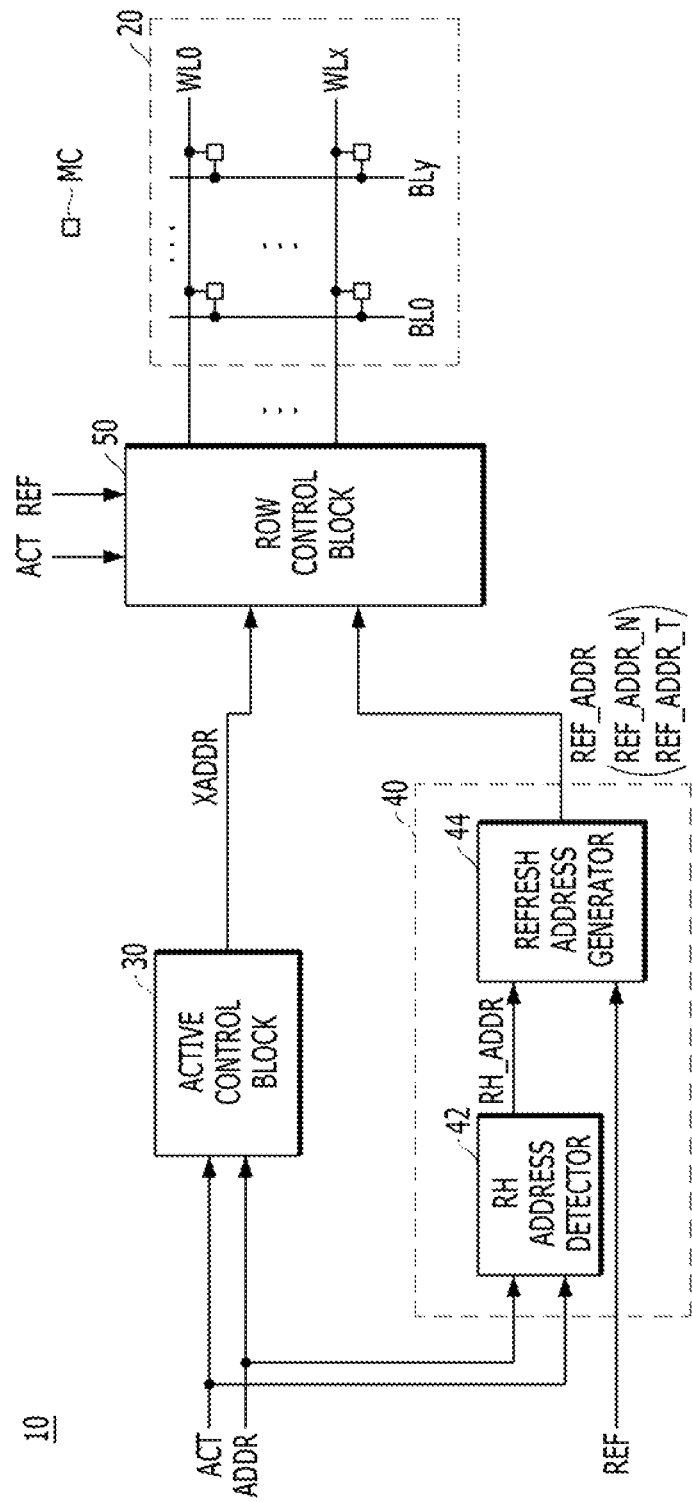
FIG. 2A is a block diagram lustrating a semiconductor memory device that performs a target refresh operation, in accordance with an embodiment of the present invention.
Figure 2B:
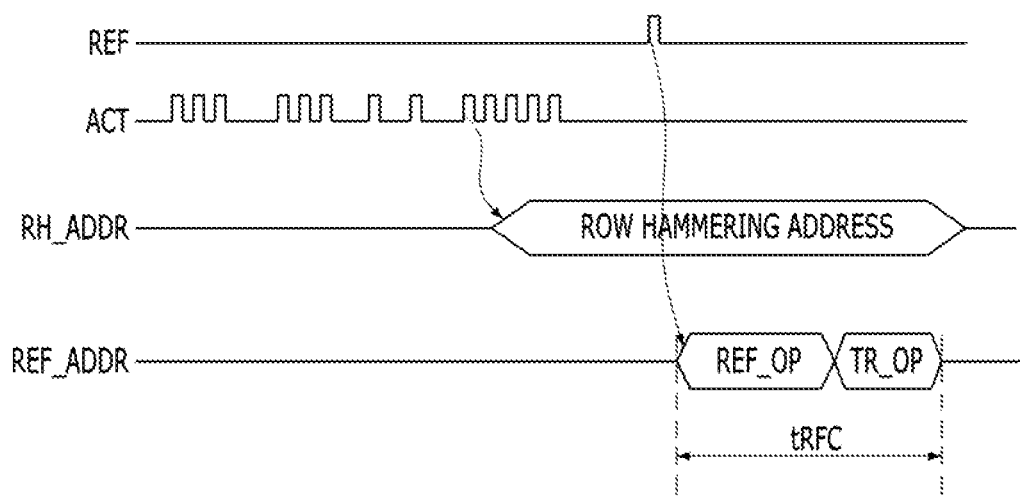
FIG. 2B is a timing diagram illustrating a refresh operation of the semiconductor memory device shown in FIG. 2A.

FIG. 2A is a block diagram illustrating a semiconductor memory device 10 that performs a target refresh operation, according to an embodiment of the present invention. FIG. 2B is a timing diagram illustrating a refresh operation of the semiconductor memory device 10 shown in FIG. 2A.

Referring to FIG. 2A, the semiconductor memory device 10 may include a memory array region 20, an active control block 30, a refresh control block 40, and a row control block 50.

The memory array region 20 may include a plurality of word lines WL0 to WLx (where x is a natural number), a plurality of bit lines BL0 to BLy (where y is a natural number), and a plurality of memory cells MC that are coupled between the word lines WL0 to WL and the bit lines BL0 to BLy. The active control block 30 may output a row address XADDR which corresponds to an external address ADDR inputted from a device external to the semiconductor memory device, when an active signal ACT is inputted. When a refresh signal REF is inputted, the refresh control block 40 may output a refresh address REF_ADDR for performing a normal refresh operation and a target refresh operation. The row control block 50 may activate a word line corresponding to the row address XADDR in response to the active signal ACT so that a normal operation, such as a read operation or a write operation, is performed. Also, the row control block 50 may activate a word line corresponding to the refresh address REF_ADDR in response to the refresh signal REF so that a refresh operation is performed. Herein, the refresh signal REF is a signal that is internally generated when a refresh command is inputted, and the active signal ACT is a signal that is internally generated when an active command is inputted. The command and the signal may be substantially the same.

The refresh control block 40 may include a row hammering (RH) address detector 42 and a refresh address generator 44.

The row hammering address detector 42 may detect a row hammering address RH_ADDR based on the active signal ACT and the external address ADDR. When the refresh signal REF is inputted, the refresh address generator 44 may sequentially output the refresh addresses REF_ADDR_N for performing a normal refresh operation and output the refresh address REF_ADDR_T corresponding to a target address that is calculated based on the row hammering address RH_ADDR. Herein, the row hammering address RH_ADDR may correspond to an address of a row hammering word line. Herein, the row hammering word line may be defined as a word line that is activated more than a predetermined number of times, a word line whose frequency of being activated is equal to or greater than a predetermined frequency, or a word line that may deteriorate the data of the memory cells coupled to a neighboring word line. The target address may be defined as an address corresponding to a neighboring word line of the row hammering word line. A neighboring word line may be a word line adjacent to the row hammering word line.

The row hammering address detector 42 detect and generate the row hammering address RH_ADDR based on the external addresses ADDR. More specifically, referring to FIG. 2B, the row hammering address detector 42 may count the number of identical external addresses ADDR among the external addresses ADDR that are inputted whenever the active signal ACT is activated, and when the count number for an external address becomes equal to or greater than a predetermined number, the row hammering address detector 42 may designate that external address as a row hammering address detect and generate the row hammering address RH_ADDR which may then provide to the refresh address generator 44. When the refresh signal REF is inputted, the refresh address generator 44 may sequentially generate and output refresh addresses REF_ADDR_N for performing a normal refresh operation for a refresh cycle tRFC. Then the refresh address generator 44 may output the refresh address REF_ADDR_T corresponding to a target address that is calculated based on the row hammering address RH_ADDR. In short, the normal refresh operation REF_OP and the target refresh operation TR_OP may be performed separately for the refresh cycle tRFC.

Therefore, when the number of times that a particular row address is activated reaches a reference number of times that may cause failure due to the row hammering effect, the semiconductor memory device 10 may detect the particular row address as the row hammering address RH_ADDR, perform the normal refresh operation RE_OP for the refresh cycle tRFC, and perform the target refresh operation TR_OP on the neighboring word line of the row hammering word line.

In the above-described row hammering prevention scheme, the row hammering address detector 42 of the refresh control block 40 counts the number of the external addresses ADDR that are inputted whenever the active signal ACT is activated so as to produce a count number for each address, and continuously performs an operation of detecting whether the count number is equal to or greater than a predetermined number. Also, the refresh address generator 44 of the refresh control block 40 generates the refresh address REF_ADDR_T designating a word line for which the target refresh operation TR_OP is to be performed in a refresh operation period or a standby period where a target refresh operation is not likely to be performed because the possibility for the occurrence of the row hammering effect is low. Therefore, one limitation of this target refresh operation is that a portion of the refresh cycle tRFC has to be unnecessarily reserved to perform the target refresh operation, and hence, current and power are wastefully consumed to unnecessarily perform the target refresh operation.

To address this concern, another target refresh operation method is provided which is capable of selectivey performing a row hammering detecting operation and a row hammering covering operation based on an active signal and a refresh signal, as described hereinafter.

Figure 3:
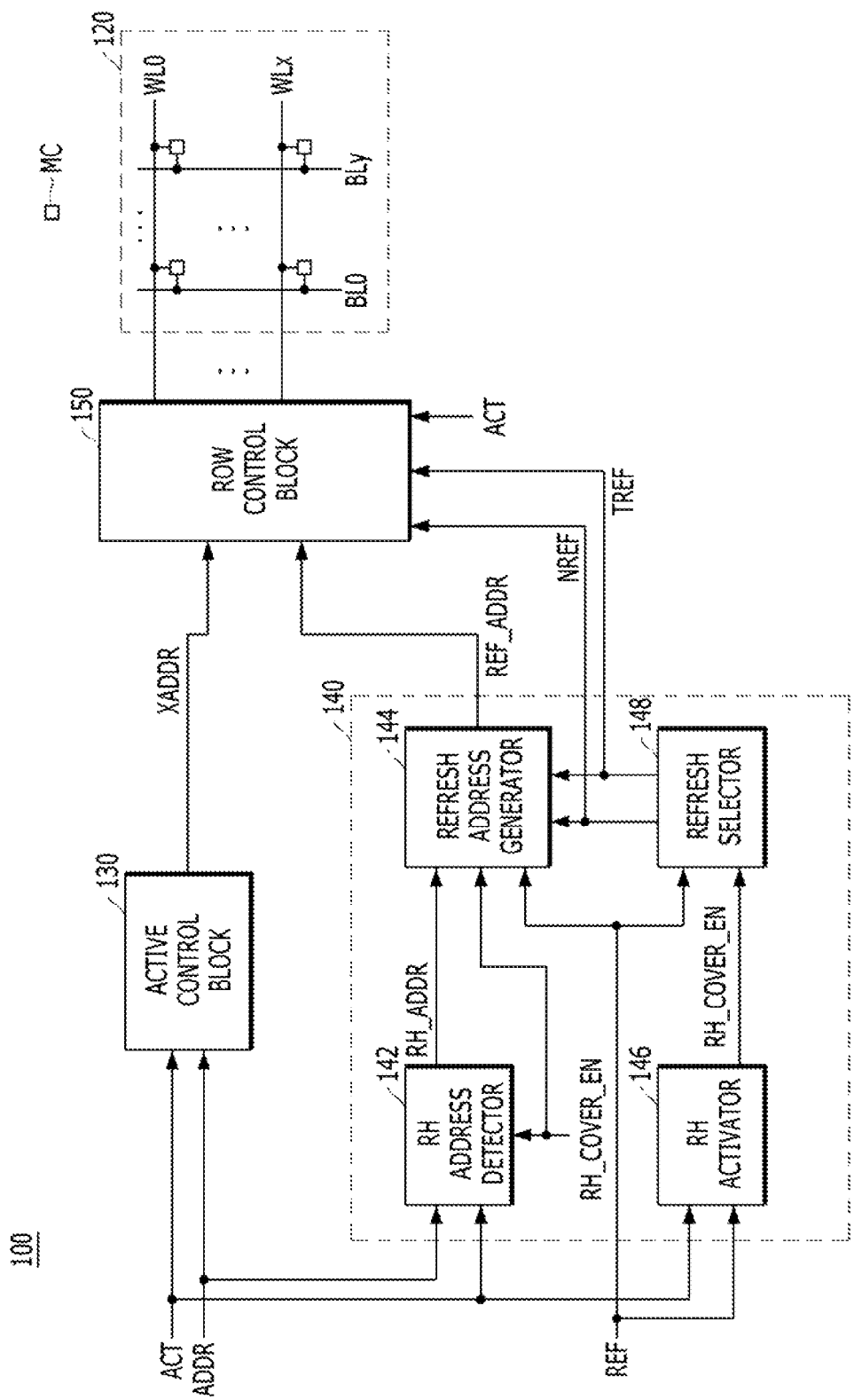
FIG. 3 is a block diagram illustrating a semiconductor memory, in accordance with an embodiment of the present invention.

FIG. 3 is a block diagram illustrating a semiconductor memory device 100, in accordance with an embodiment of the present invention.

Referring to FIG. 3, the semiconductor memory device 100 may include a memory array region 120 an active control block 130, a refresh control block 140, and a row control block 150.

The memory array region 120 may include a plurality of word lines WL0 to WLx (where x is a natural number), a plurality of bit lines BL0 to BLy (where y is a natural number), and a plurality of memory cells MC that are coupled between the word lines WL0 to WLx and the bit lines BL0 to BLy.

The active control block 130 may generate a row address XADDR which corresponds to an external address ADDR inputted from a device external to the semiconductor memory device, when an active signal ACT is inputted.

The refresh control block 140 may control to perform a normal refresh operation on the word lines WL0 to WLx in response to a refresh signal REF, count the number of the active signals ACT that are inputted between at least two neighboring refresh signals REF, and when the count number is equal to or greater than a predetermined reference number, the refresh control block 140 may perform a target refresh operation on a word line corresponding to a target address. In this embodiment of the present invention, a normal refresh operation and a target refresh operation may be performed in one refresh cycle, e.g., a refresh row cycle time tRFC, corresponding to one refresh signal REF. When the number of the active signals ACT is smaller than a predetermined number, a target refresh operation is not to performed in one refresh cycle tRFC but it is skipped. In this embodiment of the present invention, the normal refresh operation may be a method of sequentially refreshing a plurality of word lines, and the target refresh operation may be a method of refreshing the neighboring word lines of a row hammering word line. In some embodiments, the row hammering word line may include a word line that is activated more than a predetermined number of times, a word line whose frequency of being activated is equal to or greater than a predetermined frequency, or a word line that may deteriorate the data of the memory cells coupled to a neighboring word line.

For example, the refresh control block 140 may output a counting address N_ADDR (shown in FIG. 5), which is generated by counting the refresh signals REF, as a refresh address REF_ADDR, count the number of the active signals ACT that are inputted between at least two neighboring refresh signals REF, and when the count number is equal to or greater than a predetermined number, the refresh control block 140 may output a target address T_ADDR. (shown in FIG. 5) as a refresh address REF_ADDR.

The row control block 150 may activate a word line corresponding to a row address XADDR in response to the active signal ACT and perform a normal operation such as a read operation or a write operation. Also, the row control block 150 may activate a word line corresponding to the refresh address REF_ADDR in response to a target refresh selection signal TREF received from the refresh control block 140 and perform a refresh operation.

Herein, although not illustrated in the drawing, the semiconductor memory system may further include circuits (not shown) for controlling the word lines WL0 to WLx and the bit lines BL0 to BLy, reading data from the memory cells, and/or writing data in the memory cells.

The refresh control block 140 may include a row hammering (RH) address detector 142, a refresh address generator 144, a row hammering (RH) activator 146, and a refresh selector 148.

The row hammering activator 146 may count the number of the active signals ACT that are inputted between at least two neighboring refresh signals REF, and when the count number is equal to or greater than a predetermined number, the row hammering activator 146 may generate a row hammering activating signal RH_COVER_EN.

The refresh selector 148 may generate at least one of a normal refresh selection signal NREF and he target refresh selection signal TREF in response to the refresh signal REF and the row hammering activating signal RH_COVER_EN. In particular, when the refresh signal REF is activated in a period where the row hammering activating signal RH_COVER_EN is activated, the refresh selector 148 may sequentially activate the normal refresh selection signal NREF and the target refresh selection signal TREF during the refresh cycle tRFC. On the other hand, when the refresh signal REF is activated in a period where the row hammering activating signal RH_COVER_EN is inactivated, the refresh selector 148 may activate only the normal refresh selection signal NREF during the refresh cycle tRFC.

The row hammering address detector 142 may be activated in response to the row hammering activating signal RH_COVER_EN. Whenever the active signal ACT is activated, the row hammering address detector 142 may count the number of the identical external address ADDR among the inputted external addresses ADDR. When the count number becomes equal to or greater than a predetermined number, the row hammering address detector 142 may detect a row hammering address RH_ADDR. Herein, the row hammering address RH_ADDR may correspond to the address of the row hammering word line, and the target address T_ADDR may be defined as the address of a neighboring word line that is disposed adjacent to the row hammering word line.

The refresh address generator 144 may generate the counting address N_ADDR (shown in FIG. 5) by counting the refresh signals REF, and generate the target address T_ADDR (shown in FIG. 5) corresponding to the row hammering address RH_ADDR in response to the row hammering activating signal RH_COVER_EN. Also, the refresh address generator 144 may output the counting address N_ADDR or the target address T_ADDR as the refresh address REF_ADDR in response to the normal refresh selection signal NREF and the target refresh selection signal TREF. For example, the refresh address generator 144 may output the counting address N_ADDR as the refresh address REF_ADDR in response to the normal refresh selection signal NREF, and output the target address T_ADDR as the refresh address REF_ADDR in response to the target refresh selection signal TREF.

As described above, the refresh control block 140 of the semiconductor memory device 100 may count the number of active signals ACT that are inputted between at least two neighboring refresh signals REF. When the count number is equal to or greater than a predetermined number, the refresh control block 140 may activate the row hammering activating signal RH_COVER_EN. In response to the row hammering activating signal RH_COVER_EN, the row hammering address detector 142 of the refresh control block 140 may selectively perform a row hammering detecting operation and the refresh address generator 144 may selectively perform a row hammering covering operation. In short, it is possible to reduce unnecessary allocation of the refresh cycle tRFC and wasteful current consumption by not performing a target refresh operation when the number of active signals ACT that are inputted between neighboring refresh signals REF is smaller than the predetermined number, that is, in a period where the target refresh operation is not likely to be performed because the possibility that the row hammering effect occurs is low.

Hereafter, the structures of the constituent elements are described in detail by referring to the accompanying drawings.

Figure 4:
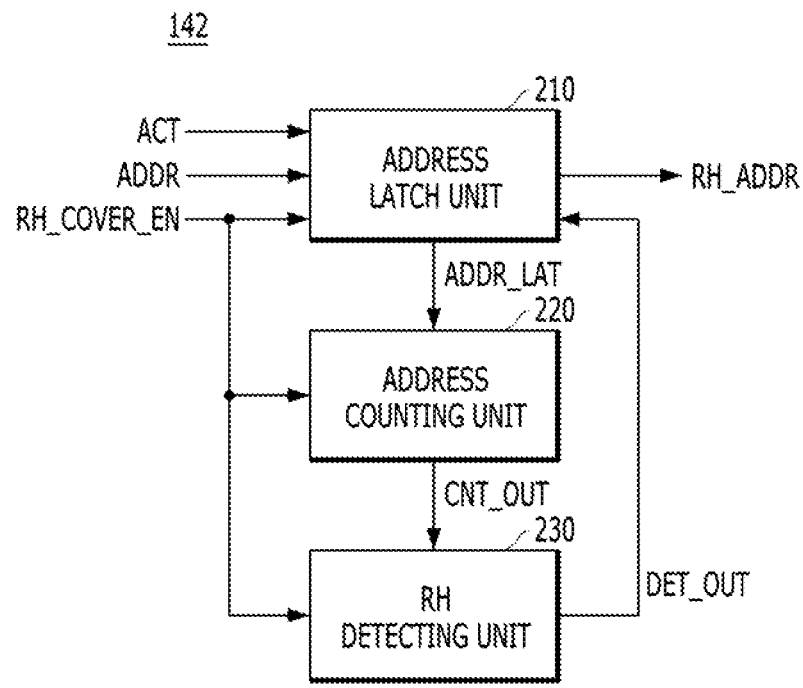
FIG. 4 is a block diagram illustrating a row hammering (RH) address detector shown in FIG. 3, in accordance with an embodiment of the present invention.

FIG. 4 is a block diagram illustrating the row hammering address detector 142 shown in FIG. 3, in accordance with an embodiment of the present invention.

Referring to FIG. 4, the row hammering address detector 142 may include an address latch unit 210, an address counting unit 220, and a row hammering (RH) detecting unit 230.

The address latch unit 210 may be activated in response to the row hammering activating signal RH_COVER_EN, and may store the external address ADDR that is inputted whenever the active signal ACT is activated. The address latch unit 210 may output the stored external address ADDR as the row hammering address RH_ADDR according to a detection result DET_OUT which is outputted from the row hammering detecting unit 230. The address counting unit 220 may be activated in response to the row hammering activating signal RH_COVER_EN. The address counting unit 220 may count the number of the identical address among the external addresses ADDR_LAT that are stored in the address latch unit 210. The row hammering detecting unit 230 may be activated in response to the row hammering activating signal RH_COVER_EN. When a counting result CNT_OUT of the address counting unit 220 is equal to or greater than a predetermined number, the row hammering detecting unit 230 may detect the row hammering address RH_ADDR and transfer the detection result DET_OUT to the address latch unit 210.

As described above, the row hammering address detector 142 may perform the operation of detecting and outputting the row hammering address RH_ADDR, which is a row hammering detecting operation, only when the row hammering activating signal RH_COVER_EN is activated. Therefore, the row hammering address detector 142 may reduce the unnecessary allocation of the refresh cycle tRFC for a target refresh operation and wasteful current consumption for the target refresh operation by not performing the row hammering detecting operation in a period where the target refresh operation is not likely to be performed because the possibility for the occurrence of the row hammering effect is low.

Figure 5:
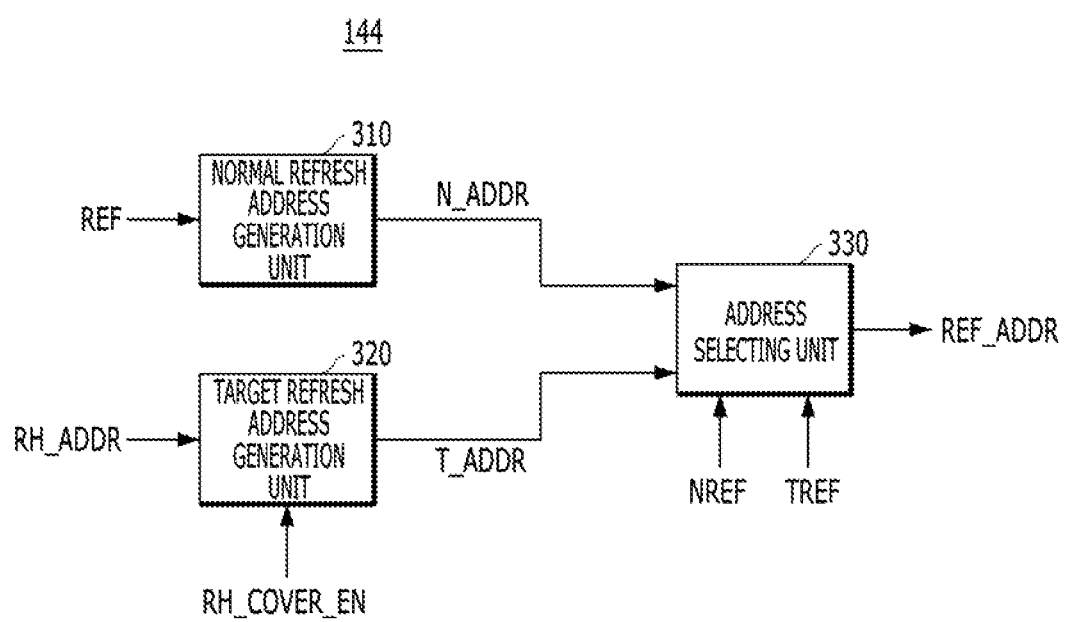
FIG. 5 is a block diagram illustrating a refresh address generator shown in FIG. 3, in accordance with an embodiment of the present invention.

FIG. 5 is a block diagram illustrating the refresh address generator 144 shown in FIG. 3 in accordance with an embodiment of the present invention.

Referring to FIG. 5, the refresh address generator 144 may include a normal refresh address generation unit 310, a target refresh address generation unit 320, and an address selecting unit 330.

The normal refresh address generation unit 310 may count the refresh signal REF so as to produce the counting address N_ADDR. According to an embodiment of the present invention, the normal refresh address generation unit 310 may include a K-bit counter, where K is a natural number corresponding to the number of the bits of the counting address N_ADDR.

The target refresh address generation unit 320 may be activated in response to the row hammering activating signal RH_COVER_EN, and may generate the target address T_ADDR corresponding to the row hammering address RH_ADDR. According to an embodiment of the present invention, the target refresh address generation unit 320 may include an up-counter which up-counts the inputted row hammering address RH_ADDR by a predetermined number of bits, e.g., one bit or two bits, and a down-counter which down-counts the inputted row hammering address RH_ADDR by a predetermined number of bits, e.g., one bit or two bits.

The address selecting unit 330 may select the counting address N_ADDR in response to the normal refresh selection signal NREF, select the target address T_ADDR in response to the target refresh selection signal TREF, and output the selected address as the refresh address REF_ADDR.

As described above, when the row hammering activating signal RH_COVER_EN is inactivated, the refresh address generator 144 may not generate the target address T_ADDR and may output the counting address N_ADDR as the refresh address REF_ADDR in response to the normal refresh selection signal NREF. Therefore, the refresh address generator 144 may save unnecessary allocation of the refresh cycle tRFC and current consumption for a target refresh operation by not performing a row hammering covering operation in a period of a refresh operation where a target refresh operation is not likely to be performed because the possibility for the occurrence of the row hammering effect is low.

Figure 6:
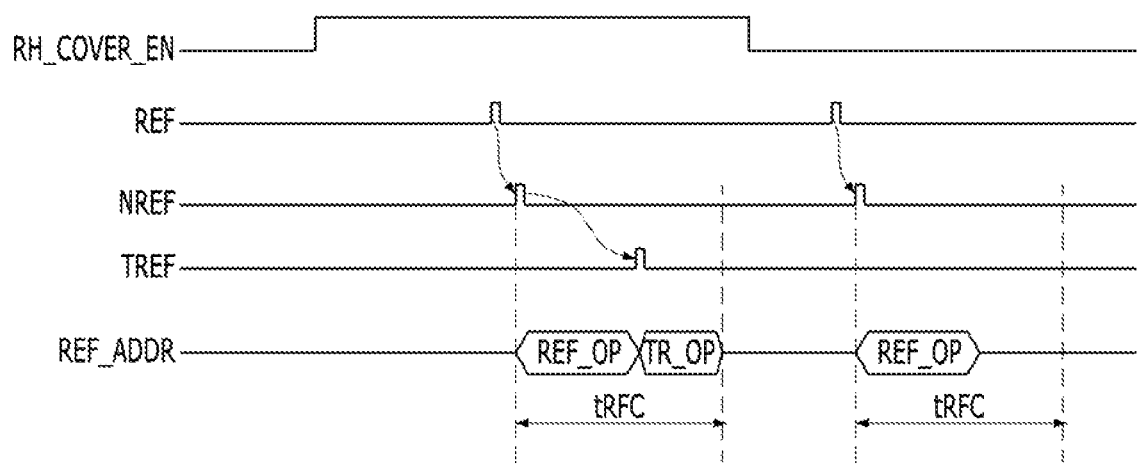
FIG. 6 is an operation waveform diagram of a refresh selector shown in FIG. 3, in accordance with an embodiment of the present invention.

FIG. 6 is an operation waveform diagram of the refresh selector 148 shown in FIG. 3 in accordance with an embodiment of the present invention.

Referring to FIG. 6, when the refresh signal REF is activated in a period where the row hammering activating signal RH_COVER_EN is activated, the refresh selector 148 may sequentially activate the normal refresh selection signal NREF and the target refresh selection signal TREF during one refresh cycle tRFC. As a result, during one refresh cycle tRFC, a normal refresh operation REF_OP may be sequentially performed onto the word lines WL0 to WLx, and the target refresh operation TR_OP may be performed on a word line corresponding to a target address.

Conversely, when the refresh signal REF is activated in a period where the row hammering activating signal RH_COVER_EN is inactivated, the refresh selector 148 may activate only the normal refresh selection signal NREF during one refresh cycle tRFC. As a result, during one refresh cycle tRFC, a normal refresh operation REF_OP may be sequentially performed onto the word lines WL0 to WLx, and the target refresh operation TR_OP may not be performed but it may be skipped.

Figure 7:
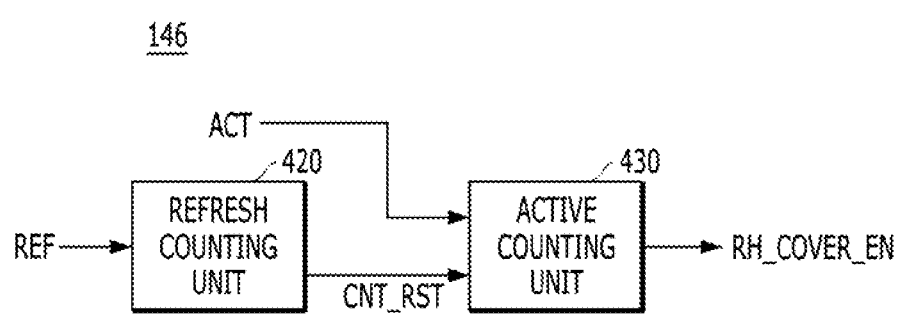
FIG. 7 is a block diagram illustrating a row hammering (RH) activator shown in FIG. 3, in accordance with an embodiment of the present invention.

FIG. 7 is a block diagram illustrating the row hammering activator 146 shown in FIG. 3 in accordance with an embodiment of the present invention.

Referring to FIG. 7, the row hammering activator 146 may include a refresh counting unit 420 and an active counting unit 430. The refresh counting unit 420 may count the refresh signal REF. When the number of the refresh signal REF reaches a predetermined number, the refresh counting unit 420 may generate a reset signal CNT_RST. The active counting unit 430 may be reset in response to the reset signal CNT_RST, and may count the number of the active signal ACT. When the counted number of the active signal ACT becomes equal to or greater than a reference number, the active counting unit 430 may output the row hammering activating signal RH_COVER_EN. The predetermined number of the refresh counting unit 420 and the reference number of the active counting unit 430 may be set according to system specification or user option.

As described above, the row hammering activator 146 may count the number of the active signals ACT that are inputted between at least two neighboring refresh signals REF. When the counted number of the active signals ACT becomes equal to or greater than a reference number, the row hammering activator 146 may generate the row hammering activating signal RH_COVER_EN.

Figure 8:
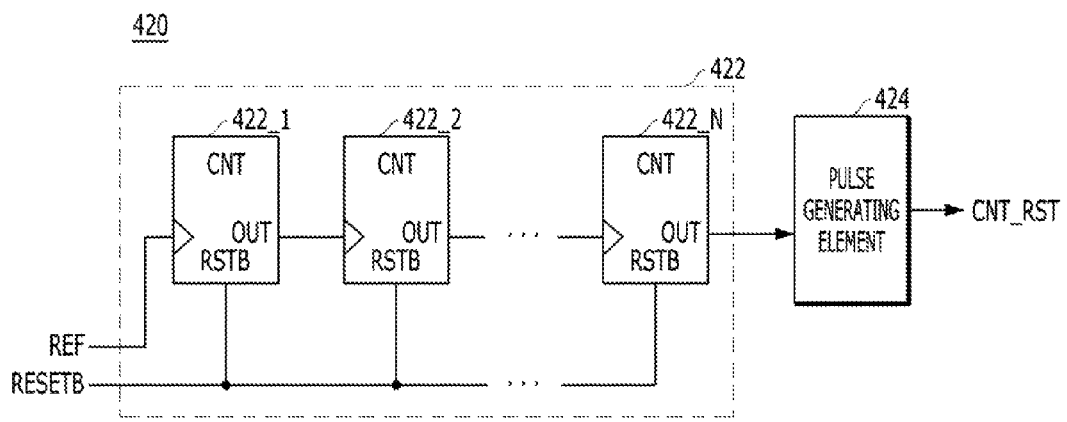
FIG. 8 is a block diagram illustrating a refresh counting unit shown in FIG. 7, in accordance with an embodiment of the present invention.

FIG. 8 is a block diagram illustrating the refresh counting unit 420 shown in FIG. 7 in accordance with an embodiment of the present invention.

Referring to FIG. 8, the refresh counting unit 420 may include a first counting element 422 and a pulse generating element 424.

The first counting element 422 may include first to $N^{th}$ unit counters 422_1 to 422_N that are coupled in series, where N is a natural number that is equal to or greater than '1'. The first unit counter 422_1 may receive the refresh signal REF through a clock terminal, and the other unit counters 422_2 to 422_N may receive an output signal of the preceding unit counter through their clock terminal. The pulse generating element 424 may receive an output signal of the $N^{th}$ unit counter 422_N and generate the reset signal CNT_RST which is a pulse signal that is activated in a predetermined period. Herein, the first to $N^{th}$ unit counters 422_1 to 422_N may receive a reset signal RESETB through a reset terminal RSTB.

Therefore, the refresh counting unit 420 may activate the reset signal CNT_RST when the refresh signal REF is activated N times. For example, when the first counting element 422 includes three unit counters, which is a case where N is 3 (i.e., N=3), the refresh counting unit 420 may activate the reset signal CNT_RST, when the refresh signal REF is activated three times, that is, at every three refresh cycles RFC.

Figure 9:
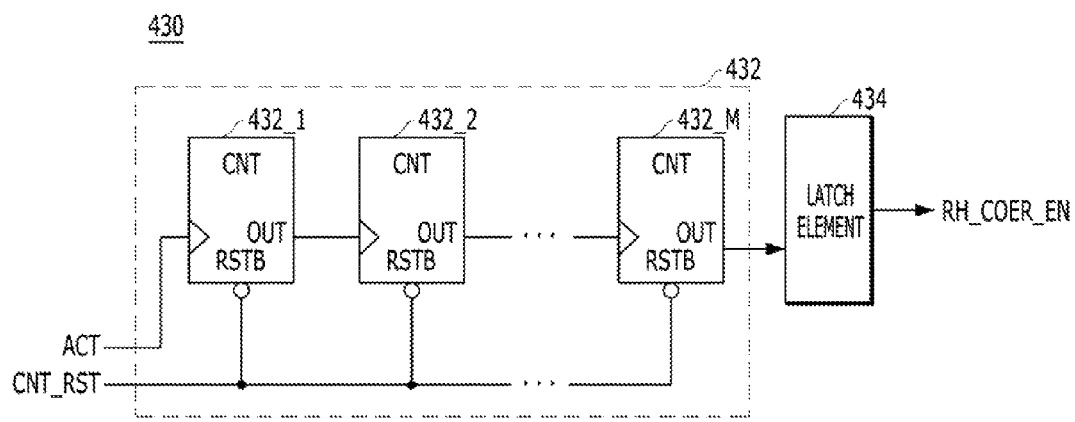
FIG. 9 is a block diagram illustrating an active counting unit shown in FIG. 7, in accordance with an embodiment of the present invention.

FIG. 9 is a block diagram illustrating the active counting unit 430 shown in FIG. 7 in accordance with an embodiment of the present invention.

Referring to FIG. 9, the active counting unit 430 may include a second counting element 432 and a latch element 434.

The second counting element 432 may include first to $M^{th}$ unit counters 432_1 to 432_M that are coupled in series, where M is a natural number that is equal to or greater than '1'. The first to $M^{th}$ unit counters 432_1 to 432_M may be reset in response to the reset signal CNT_RST. The first unit counter 432_1 may receive the active signal ACT through a clock terminal, and the other unit counters 432_2 to 432_M may receive an output signal of the preceding unit counter through their dock terminal. According to another embodiment of the present invention, M may be a natural number ranging from hundreds to thousands.

The latch element 434 may latch an output of the $M^{th}$ unit counter 432_M and output it as the row hammering activating signal RH_COVER_EN. According to an embodiment of the present invention, the latch element 434 may be an SR latch that receives an output of the $M^{th}$ unit counter 432_M through a set terminal, and receives the reset signal CNT_RST through a reset terminal.

Therefore, the active counting unit 430 may activate the row hammering activating signal RH_COVER_EN when the active signal ACT is activated M times, and may inactivate the row hammering activating signal RH_COVER_EN in response to the reset signal CNT_RST.

Hereafter, the operation of the row hammering activator 146 is described in accordance with an embodiment of the present invention by referring to FIGS. 7 to 10.

Figure 10:
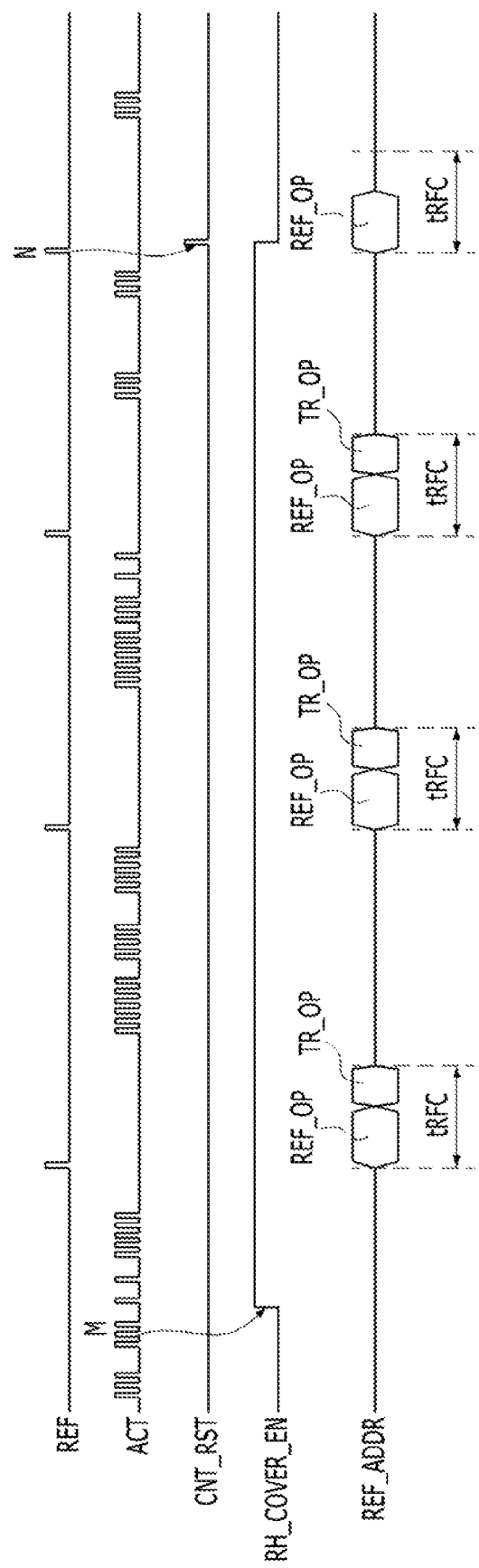
FIG. 10 is an operation waveform diagram of the row hammering activator shown in FIG. 7, in accordance with an embodiment of the present invention.

FIG. 10 is an operation waveform diagram of the row hammering activator 146 shown in FIG. 7, in accordance with an embodiment of the present invention.

Referring to FIG. 10, the active counting unit 430 of the row hammering activator 146 may activate the row hammering activating signal RH_COVER_EN when the active signal ACT is activated M times, e.g., hundreds to thousands of times. As a result, during one refresh cycle tRFC, the normal refresh operation REF_OP may be sequentially performed on the word lines WL0 to WLx and the target refresh operation TR_OP may be performed on a word line corresponding to the target address.

Subsequently, the refresh counting unit 420 of the row hammering activator 146 may activate the reset signal CNT_RST when the refresh signal REF is activated N times. The active counting unit 430 may inactivate the row hammering activating signal RH_COVER_EN in response to the reset signal CNT_RST. As a result, during one refresh cycle tRFC, the normal refresh operation REF_OP may be sequentially performed onto the word lines WL0 to WLx, and the target refresh operation TR_OP may not be performed but it may be skipped.

Herein, when the active signal ACT is activated less than M times, the row hammering activating signal RH_COVER_EN may not be activated anymore and thus remains inactive. Also, in an idle mode or a standby mode in which the refresh signal REF is inputted and the active signal ACT is not inputted, the semiconductor memory device does not perform the row hammering detecting and the row hammering covering operations. Therefore, according to an embodiment of the present invention, it is possible to save the allocation of the refresh cycle tRFC and current consumption that are required to perform a target refresh operation by not performing the row hammering covering operation in a period of a refresh operation where the target refresh operation does not have to be performed because the possibility for the occurrence of the row hammering effect is low or in the idle or standby mode where the refresh signal REF is inputted and the active signal ACT is not inputted.

A method of selectively performing the row hammering detecting operation and the row hammering covering operation based on the active signal ACT and the refresh signal REF, in accordance with another embodiment of the present invention is described hereafter.

Figure 11:
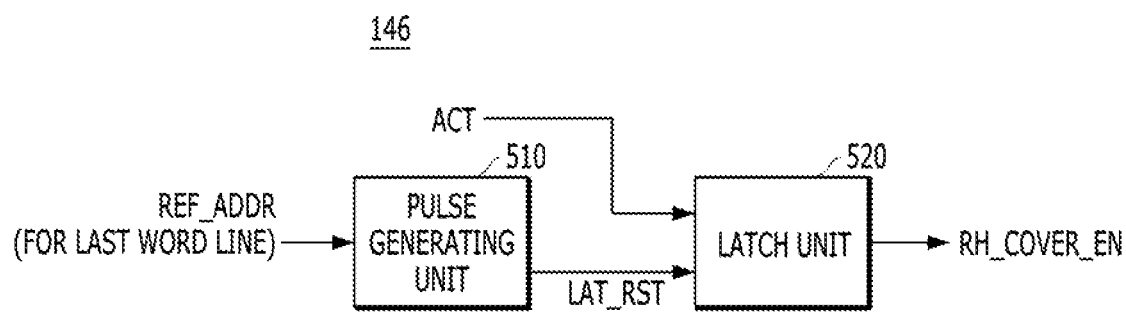
FIG. 11 is a block diagram illustrating a row ham hammering (RH) activator shown in FIG. 3, in accordance with another embodiment of the present invention.

FIG. 11 is a block diagram illustrating the row hammering activator 146 shown in FIG. 3, in accordance with another embodiment of the present invention.

Referring to FIG. 11 the row hammering activator 146 may include a pulse generating unit 510 and a latch unit 520. The pulse generating unit 510 may generate a reset signal LAT_RST, when the normal refresh operation REF_OP is sequentially performed onto the word lines WL0 to WLx and then the refresh address REF_ADDR corresponding to the last word line, which is the word line WLx, is inputted. The latch unit 520 may be set in response to the active signal ACT, may be reset in response to the reset signal LA_RST, and may output the row hammering activating signal RH_COVER_EN.

The row hammering activator 146 that is described above with reference to FIGS. 7 to 10 may count the number of the active signals ACT that are inputted between at least two neighboring refresh signals REF. When the counted number is equal to or greater than the reference number, the row hammering activator 146 may activate the row hammering activating signal RH_COVER_EN. In contrast, the row hammering activator 146 that is described herein with reference to FIG. 11 may generate a row hammering activating signal RH_COVER_EN that is activated in response to the active signal ACT which is inputted for the first time and then inactivated when the refresh address REF_ADDR corresponding to the last word line, which is the word line WLx, is inputted.

Hereafter, the structures of the constituent elements are described in detail.

Figure 12:
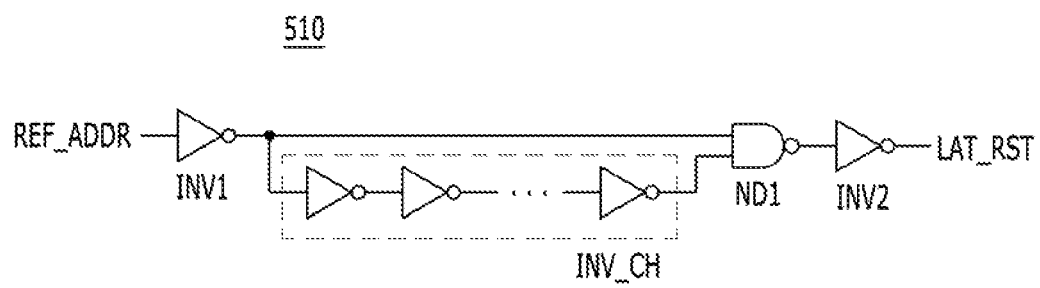
FIG. 12 is a circuit diagram illustrating a pulse generating unit shown in FIG. 11, in accordance with an embodiment of the present invention.

FIG. 12 is a circuit diagram illustrating the pulse generating unit 510 shown in FIG. 11 in accordance with an embodiment of the present invention.

Referring to FIG. 12, the pulse generating unit 510 may include a first inverter INV1, an inverter chain INV_CH, a NAND gate ND1, and a second inverter INV2.

The first inverter INV1 may receive and invert the refresh address REF_ADDR corresponding to the last word line, which is the word line WLx. The inverter chain INV_CH may include an odd number of inverters. The inverter chain INV_CH may delay and invert an output of the first inverter INV1. The NAND gate ND1 and the second inverter INV2 may perform an AND operation onto the output of the first inverter INV1 and an output of the inverter chain INV_CH.

Therefore, when the refresh address REF_ADDR corresponding to the last word line, which is the word line WLx, is inputted, the pulse generating unit 510 may generate the reset signal LAT_RST that is activated after a predetermined time passes.

Figure 13:
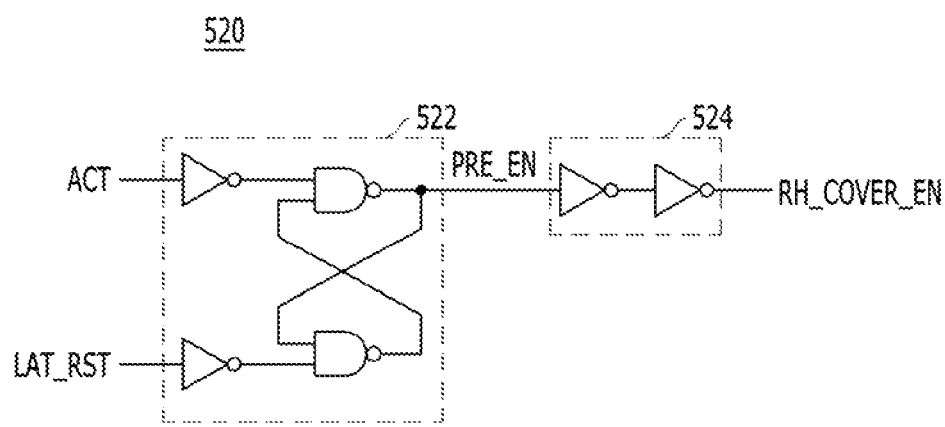
FIG. 13 is a circuit diagram illustrating a latch unit shown in FIG. 11, in accordance with an embodiment of the present invention.

FIG. 13 is a circuit diagram illustrating the latch unit 520 shown in FIG. 11 in accordance with an embodiment of the present invention.

Referring to FIG. 13, the latch unit 520 may include an SR latch element 522 and a buffer element 524.

The SR latch element 522 may receive the active signal ACT through a set terminal, receive the reset signal LAT_RST through a reset terminal, and output a preliminary activation signal PRE_EN. The buffer element 524 may buffer the preliminary activation signal PRE_EN and output the buffered preliminary activation signal PRE_EN. as the row hammering activating signal RH_COVER_EN.

Therefore, the latch unit 520 may output the row hammering activating signal RH_COVER_EN that is activated in response to the active signal ACT that is inputted first and reset in response to the reset signal LAT_RST which is activated after a predetermined time passes from a moment when the refresh address REF_ADDR corresponding to the last word line, which is the word line WLx, is inputted.

Hereafter, the operation of the row hammering activator 146 shown in FIG. 11 in accordance with another embodiment of the present invention is described with reference to FIGS. 11 to 14.

Figure 14:
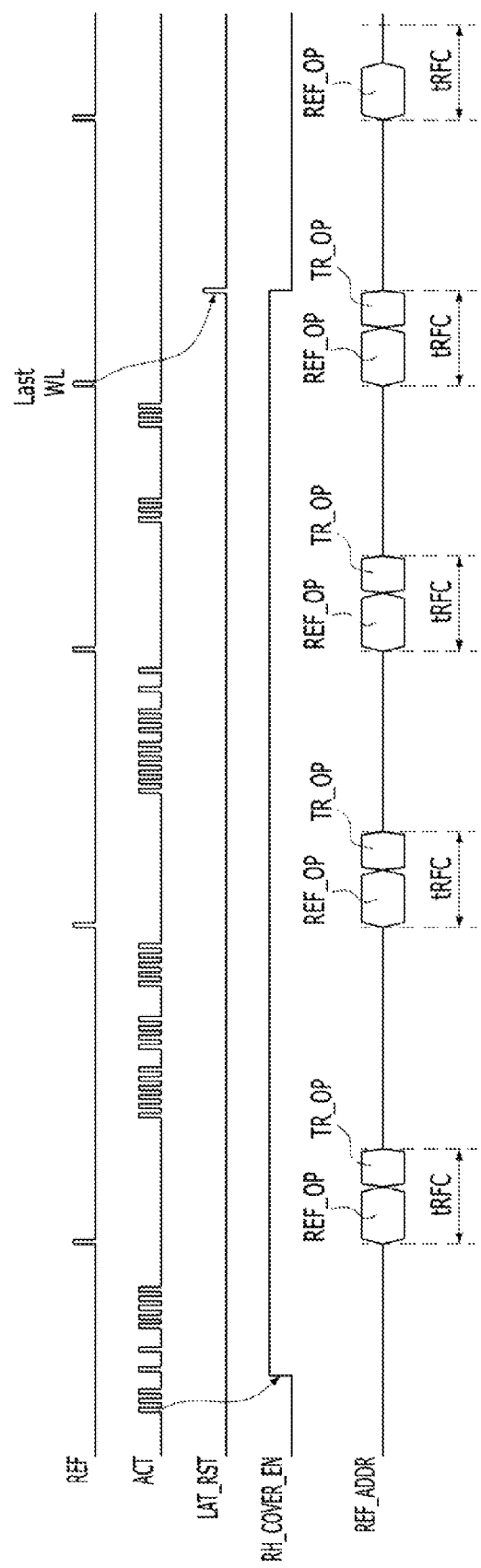
FIG. 14 is an operation waveform diagram of the row hammering activator shown in FIG. 11, in accordance with an embodiment of the present invention.

FIG. 14 is an operation waveform diagram of the row hammering activator 146 shown in FIG. 11 in accordance with an embodiment of the present invention.

Referring to FIG. 14, the latch unit 520 of the row hammering activator 146 may activate the row hammering activating signal RH_COVER_EN in response to the active signal ACT that is inputted first. As a result, during one refresh cycle tRFC, the normal refresh operation REF_OP may be sequentially performed onto the word lines WL0 to WLx and the target refresh operation TR_OP may be performed onto a word line corresponding to the target address.

Subsequently, the pulse generating unit 510 of the row hammering activator 146 may activate the reset signal LAT_RST after a predetermined time passes from a moment when the refresh address REF_ADDR corresponding to the last word line, which is the word line WLx, is inputted. The latch unit 520 may inactivate the row hammering activating signal RH_COVER_EN in response to the reset signal LAT_RST. As a result, during one refresh cycle tRFC, the normal refresh operation REF_OP may be sequentially performed onto the word lines WL0 to WLx and the target refresh operation TR_OP may not be performed but it may be skipped.

Herein, when there is no active signal ACT inputted thereafter, the row hammering activating signal RH_COVER_EN may not be activated any more but remain inactivated. Also, in the idle mode or the standby mode, which is a mode that only the refresh signal REF is inputted and the active signal ACT is not inputted, the semiconductor memory device may not perform the row hammering detecting operation and the row hammering covering operation. Therefore, in accordance with the embodiment of the present invention, it is possible to save the allocation of the refresh cycle tRFC and current consumption that are required to perform a target refresh operation by not performing the row hammering covering operation in a period of a refresh operation where the target refresh operation does not have to be performed because the possibility for the occurrence of the row hammering effect is low or in the idle or standby mode where the refresh signal REF is inputted and the active signal ACT is not inputted.

According to the embodiments of the present invention, the semiconductor memory device may prevent the data of a memory cell from deteriorating due to the row hammering effect by performing a target refresh operation.

According to the embodiments of the present invention, the semiconductor memory device may optimize a refresh operation while minimizing current consumption by skipping the performance of a target refresh operation in a period where the possibility for the occurrence of the row hammering effect is low.

While the present invention has been described with respect to specific embodiments, it will be apparent to those skilled in the art that various other changes and modifications may be made without departing from the spirit and scope of the invention as defined in the following claims.

For example, the positions and kinds of the logic gates and transistors described in the above embodiments of the present invention may be different according to the polarity of an inputted signal.

What is claimed is:

1. A semiconductor memory device comprising:
  a memory cell region including a plurality of memory cells coupled between a plurality of word lines and a plurality of bit lines; and
  a refresh control block suitable for performing a first refresh operation onto the plurality of the word lines in response to a refresh signal, generating a target address by counting the number of identical external addresses among external addresses that are inputted in response to an active signal, counting the number of the active signals that are inputted between at least two neighboring refresh signals, regardless of the external addresses, and when the counted number of the active signals is equal to or greater than a reference number, performing a second refresh operation onto a word line corresponding to the target address.

2. The semiconductor memory device of claim 1, wherein the first refresh operation and the second refresh operation are performed during a single refresh cycle corresponding to a single refresh signal.

3. The semiconductor memory device of claim 2, wherein the refresh cycle includes a refresh row cycle time (tRFC).

4. The semiconductor memory device of claim 1, wherein the first refresh operation is a normal refresh operation in which the plurality of the word lines are sequentially refreshed, and
  the second refresh operation is a target refresh operation in which neighboring word lines that are disposed adjacent to a word line whose number of times of being activated is equal to or greater than the reference number, or a word line whose frequency of being activated is equal to or greater than a reference frequency among the plurality of the word lines are refreshed.

5. The semiconductor memory device of claim 1, wherein the refresh control block includes:
  an activator suitable for counting the number of the active signals inputted between at least two neighboring refresh signals and when the counted number of the active signals is equal to or greater than the reference number generating a row hammering activating signal;
  a refresh selector suitable for generating a first refresh selection signal and a second refresh selection signal in response to the refresh signal and the row hammering activating signal;
  a row hammering address detector that is activated in response to the row hammering activating signal, suitable for counting the number of the identical external addresses among the external addresses that are inputted whenever the active signal is activated, and when the counted number of the identical external addresses is equal to or greater than a predetermined number, detecting a row hammering address;
  a refresh address generator suitable for generating a counting address by counting the refresh signal, generating the target address corresponding to the row hammering address in response to the row hammering activating signal, and outputting the counting address or the target address as a refresh address in response to the first refresh selection signal and the second refresh selection signal.

6. The semiconductor memory device of claim 5, wherein when the refresh signal is activated in a period where the row hammering activating signal is activated, the refresh selector sequentially activates the first refresh selection signal and the second refresh selection signal during one refresh cycle, and
  when the refresh signal is activated in a period where the row hammering activating signal is inactivated, the refresh selector activates the first refresh selection signal during one refresh cycle.

7. The semiconductor memory device of claim 5, wherein the refresh address generator includes:
  a first refresh address generation unit suitable for generating the counting address by counting the refresh signal;
  a second refresh address generation unit that is activated in response to the row hammering activating signal, suitable for generating the target address corresponding to the row hammering address; and
  an address selecting unit suitable for selecting the counting address in response to the first refresh selection signal, selecting the target address in response to the second refresh selection signal, and outputting the selected signal as the refresh address.

8. The semiconductor memory device of claim 5, wherein the activator includes:

a refresh counting unit suitable for counting the refresh signal and when the counted number reaches a predetermined number, generating a reset signal; and
an active counting unit that is reset in response to the reset signal, suitable for counting the number of the active signals, and when the counted number of the active signals is equal to or greater than the reference number, generates the row hammering activating signal.

9. The semiconductor memory device of claim 8, wherein the refresh counting unit includes:
a first counting element that includes first to Nth unit counters which are coupled in series, where N is a natural number equal to or greater than '1', the first unit counter receiving the refresh signal through a clock terminal, the other unit counters, which are the second to Nth unit counters, receiving an output signal of a preceding unit counter through their clock terminal; and
a pulse generating element suitable for generating the reset signal that is activated in a predetermined period based on an output of the Nth unit counter.

10. The semiconductor memory device of claim 8, wherein the active counting unit includes:
a second counting element that includes first to Mth unit counters which are coupled in series and reset in response to the reset signal, where M is a natural number equal to or greater than '1', the first unit counter receiving the active signals through a clock terminal, the other unit counters, which are the second to Mth unit counters, receiving an output signal of a preceding unit counter through their clock terminal; and
a latch element suitable for latching an output of the Mth unit counter and outputting the latched output of the Mth unit counter as the row hammering activating signal.

11. The semiconductor memory device of claim 5, further comprising:
an active control block suitable for generating a row address corresponding to an input address in response to the active signal; and
a row control block suitable for activating a word line corresponding to the row address in response to the active signal, and activating a word line corresponding to the refresh address in response to the first refresh selection signal and the second refresh selection signal.

12. A refresh control circuit comprising:
an activator suitable for counting the number of active signals that are inputted between at least two neighboring refresh signals and when the counted number of the active signals is equal to or greater than a reference number, generating a row hammering activating signals;
a refresh selector suitable for generating a first refresh selection signal and a second refresh selection signal in response to the refresh signal and the row hammering activating signal;
a row hammering address detector that is activated in response to the row hammering activating signal, suitable for counting the number of identical external addresses among external addresses that are inputted whenever an active signal is activated, and when the counted number of the identical external addresses is equal to or greater than a predetermined number, detecting a row hammering address;
a first refresh address generator suitable for generating a first refresh address by counting the refresh signal;

a second refresh address generator that is activated in response to the row hammering activating signal, suitable for generating a second refresh address calculated based on the row hammering address; and
an address selector suitable for selecting the first refresh address or the second refresh address in response to the first refresh selection signal and the second refresh selection signal.

13. The refresh control circuit of claim 12, wherein the first refresh address generator includes:
a bit counter that corresponds to the number of bits of the first refresh address, and
the second refresh address generator includes:
an up-counter which up-counts the row hammering address by a predetermined number of bits and a down-counter which down-counts the row hammering address by a predetermined number of bits.

14. The refresh control circuit of claim 12, wherein when the refresh signal is activated in a period where the row hammering activating signal is activated, the refresh selector sequentially activates the first refresh selection signal and the second refresh selection signal during one refresh cycle, and
when the refresh signal is activated in a period where the row hammering activating signal is inactivated, the refresh selector activates the first refresh selection signal during one refresh cycle.

15. The refresh control circuit of claim 12, wherein the activator includes:
a refresh counting unit suitable for counting the refresh signal and when the counted number reaches a predetermined number, generating a reset signal; and
an active counting unit that is reset in response to the reset signal, suitable for counting the number of the active signals, and when the counted number of the active signals is equal to or greater than a reference number, generating the row hammering activating signal.

16. The refresh control circuit of claim 15, wherein the refresh counting unit includes:
a first counting element that includes first to Nth unit counters which are coupled in series, where N is a natural number equal to or greater than '1', the first unit counter receiving the refresh signal through a clock terminal, the other unit counters, which are the second to Nth unit counters, receiving an output signal of a preceding unit counter through their clock terminal; and
a pulse generating element suitable for generating the reset signal that is activated in a predetermined period based on an output of the Nth unit counter.

17. The refresh control circuit of claim 15, wherein the active counting unit includes:
a second counting element that includes first to Mth unit counters which are coupled in series and reset in response to the reset signal, where M is a natural number equal to or greater than '1', the first unit counter receiving the active signals through a clock terminal, the other unit counters, which are the second to Mth unit counters, receiving an output signal of a preceding unit counter through their clock terminal; and
a latch element suitable for latching an output of the Mth unit counter and outputting the latched output of the Mth unit counter as the row hammering activating signal.

18. An operating method of a semiconductor memory device, comprising:

sequentially performing a first refresh operation onto a plurality of word lines in response to a refresh signal;

generating a target address by counting the number of identical external addresses among external addresses that are inputted in response to an active signal; and counting the number of the active signals that are inputted between at least two neighboring refresh signals, regardless of the external addresses, and when the counted number of the active signals is equal to or greater than a reference number, performing a second refresh operation onto a word line corresponding to the target address.

19. The operating method of claim 18, wherein the first refresh operation and the second refresh operation are performed during one refresh cycle which corresponds to one refresh signal, and when the counted number of the active commands is smaller than the reference number, not performing the second refresh operation during the one refresh cycle.

20. The operating method of claim 18, wherein the first refresh operation is a normal refresh operation in which the plurality of the word lines are sequentially refreshed, and the second refresh operation is a target refresh operation in which neighboring word lines that are disposed adjacent to a word line whose number of times of being activated is equal to or greater than a reference number or whose frequency of being activated is equal to or greater than a reference frequency among the plurality of the word lines are refreshed.

* * * * *